United States Patent [19]

Drafts

[11] Patent Number: 5,416,407
[45] Date of Patent: May 16, 1995

[54] ELECTRIC CURRENT SENSOR EMPLOYING HALL EFFECT GENERATOR

[75] Inventor: William A. Drafts, Orlando, Fla.

[73] Assignee: F. W. Bell, Inc., Orlando, Fla.

[21] Appl. No.: 75,950

[22] Filed: Jun. 11, 1993

[51] Int. Cl.⁶ ............................................. G01R 33/02
[52] U.S. Cl. .................... 324/117 H; 327/511
[58] Field of Search .................. 324/117 H, 225, 251; 307/309

[56] References Cited

U.S. PATENT DOCUMENTS

| | | | |
|---|---|---|---|
| 3,296,573 | 1/1967 | Heid | 338/32 |
| 3,339,129 | 8/1967 | Bulman | 317/235 |
| 3,551,706 | 12/1990 | Chapman | 307/309 |
| 4,660,018 | 4/1987 | Hatch | 338/32 |
| 4,660,065 | 4/1987 | Carvajal | 357/27 |
| 4,752,733 | 6/1988 | Fetr | 324/225 |
| 4,945,306 | 7/1990 | Lowther | 324/220 |
| 4,994,742 | 2/1991 | Lowther | 324/251 |

Primary Examiner—Kenneth A. Wieder
Assistant Examiner—Mark Wardas
Attorney, Agent, or Firm—Dominik, Stein, Saccocio, Reese, Colitz & Van Der Wall

[57] ABSTRACT

An electric current sensor employing a Hall effect generator to be used in measuring electrical currents flowing in an electrical conductor. The sensor comprises an amplifier, a constant current source, a gapped toroid core mounted on the component side of a printed circuit board (PCB), a Hall effect generator extending via its output leads from the PCB into the gap of the toroid core, and an inductive loop positioned at the edge of the gap of the toroid core. The inductive loop itself comprises a simple trace formed on the component side of the PCB together with its plated-through-holes extending from the component of the PCB to the printed circuit (clad) side of the PCB. The PCB inductive loop placed at the edge of the gap of the toroid core and connected in series opposition to the output leads of the Hall effect generator, compensates for the unwanted induced voltages in the output leads of the Hall generator.

5 Claims, 2 Drawing Sheets

ELECTRIC CURRENT SENSOR EMPLOYING HALL EFFECT GENERATOR

BACKGROUND OF THE INVENTION

1. Field Of The Invention

This invention relates to an electric current sensor and, more particularly, to a compensated transient response electric current sensor that utilizes a Hall effect generator positioned in a gap of a toroid to produce an output that is proportional to the current being sensed.

2. Description of the Background Art

Many types of electrical current sensing sensors are known and are in wide use today throughout the electronics industry. Many of these sensors include a Hall effect generator that senses the magnetic field associated with an electrical current and, in turn, produces a Hall effect output voltage that is proportional to the magnetic field. However, many applications involve the measurement of an alternating or transient current. In these applications, errors in the Hall effect voltage will occur due to the changing magnetic field associated with the time varying current.

More particularly, the Hall effect output voltage is the voltage produced across opposite edges of an electrical current-carrying conductor when placed in a magnetic field. The basis of this effect, which depends upon the deflection of charged particle moving in a magnetic field, is the Loreritz force. This force is in a direction mutually perpendicular to the path of the particle movement and the magnetic field direction. As a result, an output voltage occurs across the conductor. This output voltage has a magnitude that depends upon the magnetic field present, the Hall coefficient and the excitation current in the conductor. When the excitation current is held constant, the output voltage is proportional to the magnetic field produced by the current being sensed or measured.

Hall effect generators generally comprise a layer of homogeneous semiconductor material, known as the Hall plate, constructed upon a dielectric substrate. The excitation current is applied to the Hall plate through the use of contacts positioned on opposite ends of the Hall plate. When the Hall effect generator is placed in a magnetic field and supplied with excitation current, the Hall effect output voltage is produced in the Hall plate which is orthogonal to the magnetic field and the excitation current. In order to measure this Hall effect output voltage, output leads are attached to the Hall plate in a position opposite to each other and on the axis of the Hall effect output voltage. Thus, the output leads are also exposed to the magnetic field which is impinging upon the Hall effect generator.

As a result of the output leads being exposed to the magnetic field, unwanted voltages will be induced into the leads due to electromagnetic coupling occurring when the current being sensed is a time varying current. These induced voltages will add to the actual Hall effect output voltage formed in the Hall plate and cause errors in the measurement of the sensed current. As the magnitude and frequency of the time varying magnetic field resulting from the time varying sensed current increases, the induced voltages in the output leads will become larger and larger with respect to the actual Hall effect output voltage produced in the Hall plate.

Various types of sensing devices utilizing the Hall effect phenomena have been used in the past with an attempt to eliminate the error causing induced voltages in the output leads of the Hall generator. One example of a method for compensating for the induced voltages is seen in U.S. Pat. No. 3,551,706 (commonly assigned with this application), the disclosure of which is hereby incorporated by reference herein. In this patent, a pickup loop is mounted on the dielectric substrate of the Hall effect generator in an area aligned with the normal sensitivity area of the Hall plate also constructed on the substrate. The pickup loop is positioned in close proximity to the Hall plate to sense the same flux as that which impinges upon the Hall plate. The pickup loop is connected to the Hall effect output leads and is made much larger than any other loops formed by the output leads. The output leads including the pickup loop are then connected to a circuit which has a frequency response that complements the response produced by the interaction of the responses of the Hall plate, the pickup loop and the output leads to the impinging flux, thereby providing a resultant output response from the circuit that is flat within wide frequency ranges up to 4 MHz.

The Hall effect sensor disclosed in U.S. Pat. No. 3,551,706 achieved substantial commercial success. However, the difficulty in both manufacture and tuning the circuit during test compromised the economics of the sensor.

Accordingly, it is an object of the present invention to provide a current sensor having an improved transient response, thereby resulting in more accurate measurements of sensed time varying currents.

A further object of the invention is to reduce the cost and complexity of manufacturing the current sensors having improved transient responses.

These objects should be construed to be merely illustrative of some of the more prominent features and applications of the intended invention. Many other beneficial results can be obtained by applying the disclosed invention in a different manner or by modifying the invention within the scope of the disclosure. Accordingly, other objects and a more comprehensive understanding of the invention may be obtained by referring to the summary of the invention, and the detailed description of the preferred embodiment in addition to the scope of the invention defined by the claims taken in conjunction with the accompanying drawings.

SUMMARY OF THE INVENTION

The invention is defined by the appended claims with the specific embodiment shown in the attached drawings. For the purposes of summarizing the invention, the invention comprises an electric current sensor employing a Hall effect generator to be used in measuring electrical currents flowing in an electrical conductor. The sensor comprises an amplifier, a constant current source, a gapped toroid core mounted on the component side of a printed circuit board (PCB), a Hall effect generator extending via its output leads from the PCB into the gap of the toroid core, and an inductive loop positioned at the edge of the gap of the toroid core. The inductive loop itself comprises a simple trace formed on the component side of the PCB together with its plated-through-holes extending from the component of the PCB to the printed circuit (clad) side of the PCB.

As is common in the industry, the electrical conductor whose current is to be sensed is positioned through the toroid core. A constant current source provides the Hall generator with a temperature-compensated low level current. The electrical current flowing through the conductor generates a proportional magnetic field in the core and onto the Hall generator and its output leads. The Hall generator therefore produces an output voltage that is proportional to the magnetic field concentrated onto its Hall plate. This voltage is then amplified to obtain a useful level. Unfortunately, during time varying sensed currents, voltages are also produced in the output leads of the Hall generator that skew the output voltage of the Hall generator.

The present invention compensates for the unwanted induced voltages in the output levels of the Hall generator by placing the PCB inductive loop at the edge of the gap of the toroid core and connecting it in series opposition to the output leads of the Hall effect generator. The area of this PCB inductive loop is chosen so as to be substantially the same as the area of the loop formed by the output leads of the Hall generator that extend within the gap of the core above the surface of the PCB at a predetermined height. The area is the same so as to ensure that the induced voltages in the PCB inductive loop and the output loop are relatively equal. By connecting the PCB inductive loop in series opposition to the output loop of the Hall generator, any induced voltages in the output loop will be effectively canceled out by the voltage induced in the PCB inductive loop.

Importantly, the PCB inductive loop, being fabricated in the form of a simple trace on a PCB with its plated-through-holes, ensures low cost, ease of manufacture and a controlled process which gives excellent unit to unit repeatability.

Another problem solved by the present invention is the determination of the area of the output loop formed by the output leads of the Hall generator that is normal to the magnetic field. Depending upon how much area is exposed to the field, the resulting induced voltages in the output loop will vary. Therefore, the height of the Hall generator in the gap of the toroid core is critical. This height directly determines the exposed area of the output loop. To accomplish the requirement of having exposed equal areas connected in series opposition, the Hall generator's height is experimentally adjusted within the gap of the toroid core until equality is achieved. A tool or fixture is designed so as to ensure the repeatability of the height of the Hall generator within the toroid gap during manufacture.

The foregoing has outlined rather broadly, the more pertinent and prominent features of the present invention. The detailed description of the invention that follows is offered so that the present contribution to the art may be more fully appreciated. Additional features of the invention will be described hereinafter. These form the subject of the claims of the invention. It should be appreciated by those skilled in the art that the conception and the disclosed specific embodiment may be readily utilized as a basis for modifying or designing other methods and structures for carrying out the same purposes of the present invention. It should also be realized by those skilled in the art that such equivalent methods and structures do not depart from the spirit and scope of the invention as set forth in the appended claims.

BRIEF DESCRIPTION OF THE DRAWINGS

For a more succinct understanding of the nature and objects of the invention, reference should be directed to the following description taken in conjunction with the accompanying drawings in which.

Similar reference numerals refer to similar parts throughout the several figures.

DETAILED DESCRIPTION OF THE PREFERRED EMBODIMENT OF THE INVENTION

Figure 1:
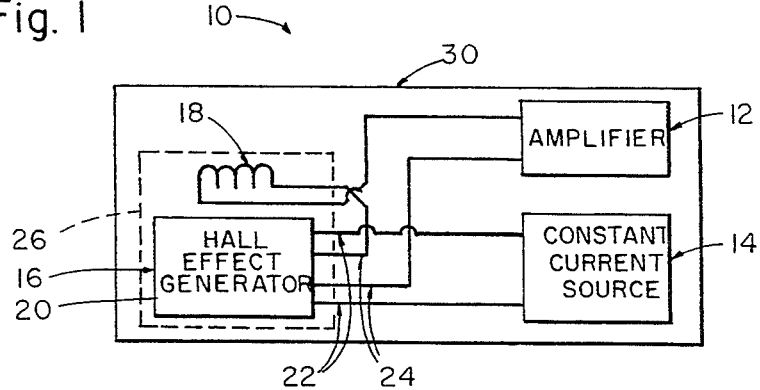
FIG. 1 is a block diagram representation of the amplifier, constant current source, Hall effect generator, and inductive loop of the electric current sensor of the invention.

As shown in FIG. 1, the electric current sensor 10 of the invention comprises an amplifier 12, a constant current source 14, a Hall effect generator 16, and an inductive loop 18. The Hall effect generator 16 comprises a standard design having a semiconductor Hall plate (not shown) mounted onto a dielectric substrate (not shown) within a sealed package 20 with its constant current leads 22 and the Hall effect output voltage leads 24 extending therefrom.

Figure 2:
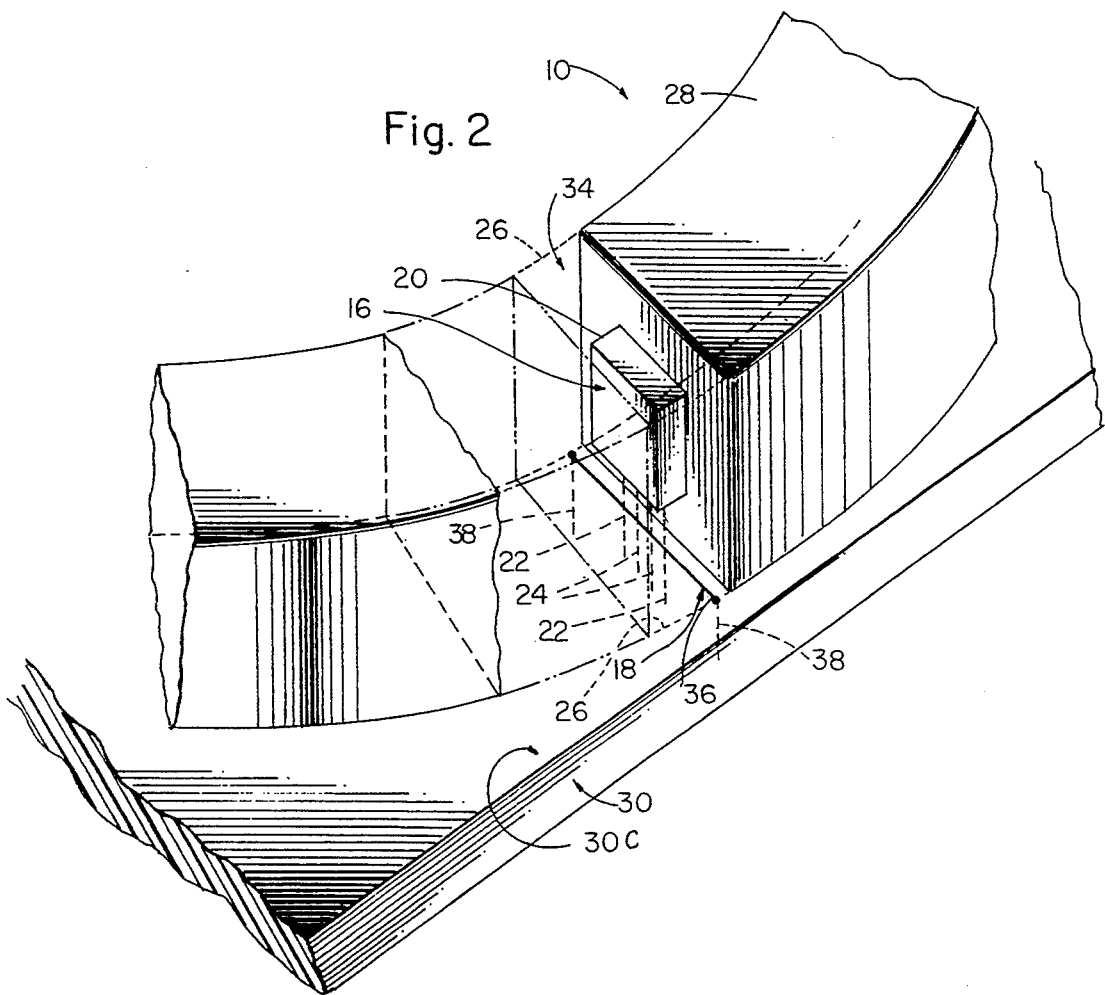
FIG. 2 is a partial perspective view, partially cut-away, showing the printed circuit board (PCB) inductive loop and Hall generator within the gap of a toroid core.
Figure 3:
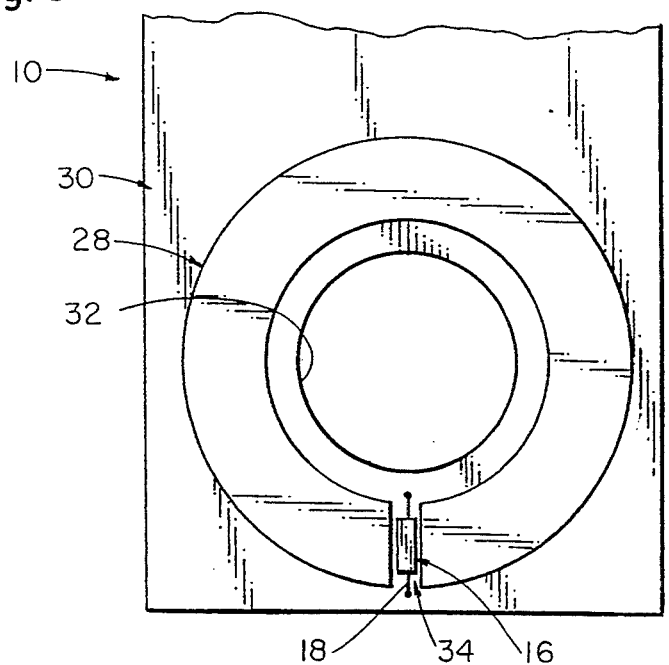
FIG. 3 is an enlarged top plan view of FIG. 2 showing the relative placement of the PCB inductive loop and the Hall generator in the gap of the toroid core.
Figure 4:
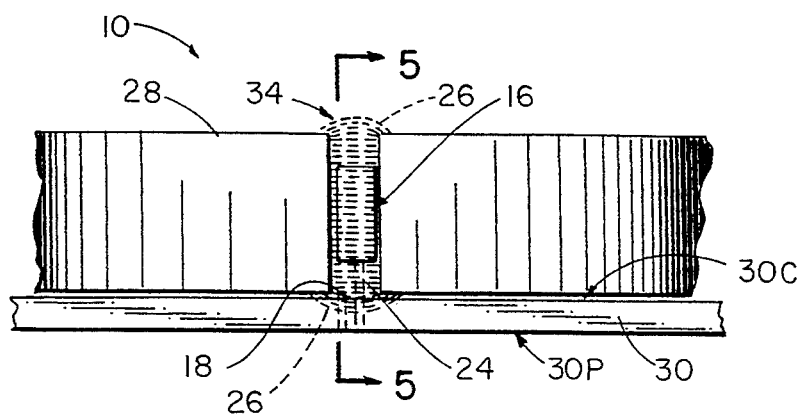
FIG. 4 is a front view of FIG. 2 showing the Hall generator and the PCB inductive loop formed by the PCB trace and its plated-through-holes.

As shown in FIGS. 2-4, the Hall effect generator 16 and the inductive loop 18 are positioned within a magnetic field, represented by dashed flux lines 26, preferably concentrated by a gapped toroid core 28 (see FIG. 3). The Hall generator 16, inductive loop 18 and the toroid core 28 are mounted on the component side 30 of a printed circuit board (PCB) 30. The PCB 30 includes a hole 32 over which the toroid core 28 is concentrically positioned. When an electrical conductor (not shown) is threaded through the hole 32 and electrical current flows through the conductor, a magnetic field 26 is created within the toroid core 28. As best shown by the flux lines 26 in FIG. 4, the magnetic field 26 extends across the gap 34 of the toroid core 28. The flux lines 26 extend substantially straight at the center of the cross-section of the toroid core 28. However, along the four edges of the gap 34, the flux lines 26 fringe outwardly beyond the perimeter of the gap 34 of the toroid core 28.

Figure 5:
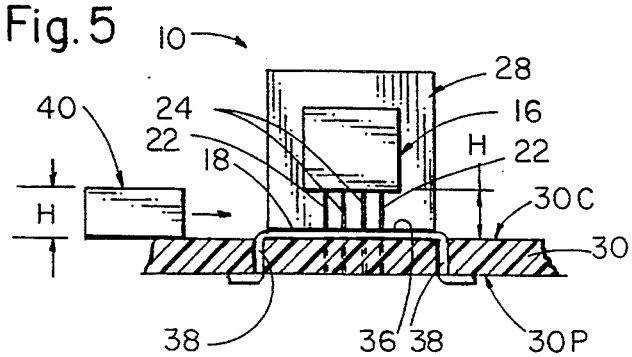
FIG. 5 is a cross-sectional view of FIG. 4 along lines 5—5 showing the PCB inductive loop formed by the PCB trace and its plated-through-holes.

As shown in FIG. 5, the inductive loop 18 comprises a trace 36 formed on the component side 30C of the PCB 30. Trace 36 comprises a simple copper clad PCB trace formed in a conventional manner. A pair of PCB holes 38 are positioned at each end of the trace 36 through the PCB. The holes 38 are plated-through in a conventional manner so as to deposit a thin layer of metal onto the inner lumen of the hole 38 thereby interconnecting the holes 38 with the trace 36. It is noted that when the PCB components are mounted and then wave-soldered, the solder completely fills the plated-through-hole 38 so as to form a solid conductor with the trace 36. As a result, it is seen that the inductive loop 18 is formed by the trace 36 and the plated-through-holes 38. Furthermore, it is seen that even though the PCB trace 36 is positioned at the edge of the gap 34, the PCB trace 36 and the plated-through-holes 38 forming the inductive loop 18 are nevertheless subjected to the fringing magnetic flux 26 that extends outside the perimeter of the gap 34. Finally, it is noted that the inductive loop 18 is connected in series opposition to the output leads 24 of the Hall effect generator 16 (see FIG. 1).

During operation, the electrical conductor is inserted through the hole 32 in the PCB 30 (see FIG. 3). As electrical current flows through the conductor, a magnetic field 26 is created within the toroid core 28 and across the gap 34. The Hall effect generator 16 and the inductive loop 18 are therefore subjected to the magnetic field 26. The constant current source 14 supplies a temperature-compensated constant current to the Hall plate. As a result, the Hall generator 16 produces an output voltage that is proportional to the magnetic field 26. However, the output voltage produced by the Hall effect generator 16 includes unwanted induced voltages that are caused by its output leads 24 forming a loop that is in the magnetic field 26 as well. Notwithstanding, the inductive loop 18, which is connected in series opposition to the output leads 24, effectively cancels the induced voltages. Being properly compensated, the output voltage is then supplied to the amplifier 30 to be amplified to a useful level.

It is noted that the area defined by the loop of the output leads 24 of the Hall effect generator 16 determines the amount of inductance created by the output leads 24 and, hence, the amount of unwanted induced voltages therein. It is noted that the inductive loop 18 formed by the PCB trace 36 and the plated-through-holes 38 define a loop having a fixed dimension. Therefore, the inductance of the inductive loop 18 is fixed and cannot be varied.

In view of the foregoing, it should be appreciated that the height H of the Hall effect generator 16 above the PCB 30 is a critical dimension. In practice, this critical height dimension H is established empirically by adjusting the height H of the Hall effect generator 16 within the gap 34 and measuring the transient response of the amplifier 12 until such time as an accurate response of the sensed current is obtained. Once an accurate transient response is obtained, the critical height dimension H is noted. A tool or fixture, generally indicated by numeral 40 (see FIG. 5), of the same height dimension H is then utilized so as to properly position the Hall effect generator 16 within the gap 34. Once properly positioned, the leads 22 and 24 of the Hall effect generator 16 are soldered into their respective printed circuit board holes thereby rigidly securing the Hall effect generator 16 into the proper position at the critical height H. Finally, it should be appreciated that the manufacturing tolerances of Hall effect generators 16 are such that satisfactory repeatability with a single fixture 40 can be achieved thereby substantially reducing assembly costs while maintaining acceptable quality control.

The present invention includes that contained in the appended claims as well as that of the foregoing description. Although this description has been described in its preferred form with a certain degree of particularity, it should be understood that the present disclosure of the preferred form has been made only by way of example and that numerous changes in the details of construction, combination, or arrangement of parts thereof may be resorted to without departing from the spirit and scope of the invention.

Now that the invention has been described, what is claimed is:

1. A sensor for sensing electric current in an electrical conductor comprising in combination:
    a printed circuit board formed of a dielectric material;
    a toroid core for positioning about the electrical conductor, said toroid core having a gap;
    means for mounting said toroid core onto said printed circuit board with the electrical conductor extending through said toroid core;
    a Hall effect generator, said Hall effect generator having output leads forming an output loop, said Hall effect generator and at least a portion of said output loop being located within said gap, said output leads being mounted to said printed circuit board;
    an inductive loop comprising a conductive trace on said printed circuit board and a pair of plated-through-holes through said printed circuit board at opposing ends of said conductive trace, said inductive loop being located at the perimeter of said gap, said inductive loop being electrically connected in series opposition to said output loop;
    a constant current source, said constant current source being electrically connected to said Hall effect generator; and
    an amplifier, said amplifier being electrically connected to said inductive loop and said Hall effect generator;
    whereby a magnetic field is created in said toroid core and across said gap and across said Hall effect generator, said portion of said output loop and said inductive loop when electrical current flows in the electrical conductor, said Hall effect generator producing an output voltage that is proportional to said magnetic field, said output loop producing unwanted output voltage, and said inductive loop producing a compensation voltage in opposition to said unwanted voltage thereby achieving an improved transient response.

2. The sensor as recited in claim 1, wherein said inductive loop has an inductive loop area and said output loop has an output loop area, said areas being substantially equal to each other.

3. The sensor as recited in claim 1, wherein said Hall effect generator is placed at a predetermined height in said gap so as to facilitate exposing a specific amount of area of said output loop to the magnetic field that is substantially equal to the area of said inductive loop exposed to the magnetic field.

4. A method for sensing electrical current in an electrical conductor, comprising the steps of:
    producing a Hall effect voltage from a Hall effect generator mounted to a printed circuit board by means of output leads in response to a magnetic field created by electrical current flowing in the electrical conductor, the Hall effect voltage including an unwanted voltage component produced by the output leads of the Hall effect generator being subjected to the magnetic field; and
    producing a compensation voltage in series opposition to said unwanted voltage component of said Hall effect voltage by positioning an inductive loop in the magnetic field, the inductive loop being formed at least in part by the combination of a printed circuit board trace and a pair of plated-through-holes formed through the printed circuit board at opposing ends of the trace, the inductive loop thus formed being connected in series opposition to said Hall effect voltage.

5. The method as set forth in claim 4, further including the step of adjusting the exposure of the output leads to the magnetic field by adjusting the height of said Hall effect generator mounted to said printed circuit board such that said compensation voltage is substantially equal to said unwanted voltage component.

* * * * *